(12) United States Patent
Chu et al.

(10) Patent No.: US 7,348,629 B2
(45) Date of Patent: Mar. 25, 2008

(54) METAL GATED ULTRA SHORT MOSFET DEVICES

(75) Inventors: Jack Oon Chu, Manhasset, NY (US);
Bruce B. Doris, Brewster, NY (US);
Meikei Ieong, Wappingers Falls, NY (US); Jing Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 11/407,473

(22) Filed: Apr. 20, 2006

(65) Prior Publication Data
US 2007/0246753 A1    Oct. 25, 2007

(51) Int. Cl.
*H01L 29/76* (2006.01)

(52) U.S. Cl. .................. 257/332; 257/346; 257/387; 257/388; 257/412; 257/E29.027

(58) Field of Classification Search .............. None
See application file for complete search history.

(56) References Cited

U.S. PATENT DOCUMENTS

| | | | |
|---|---|---|---|
| 4,899,202 A * | 2/1990 | Blake et al. ............. 257/336 |
| 5,780,899 A | 7/1998 | Hu ........................... 257/335 |
| 6,180,978 B1 | 1/2001 | Chatterjee ................ 257/327 |
| 6,271,551 B1 * | 8/2001 | Schmitz et al. ........... 257/288 |
| 6,417,538 B1 * | 7/2002 | Choi ........................ 257/315 |
| 6,555,872 B1 | 4/2003 | Dennen .................... 257/327 |
| 6,770,944 B2 | 8/2004 | Nishinohara ............. 257/402 |
| 2005/0139926 A1 | 6/2005 | Shimizu .................... 257/351 |
| 2006/0214241 A1 * | 9/2006 | Pidin ........................ 257/407 |

* cited by examiner

*Primary Examiner*—Sue A. Purvis
*Assistant Examiner*—Scott R. Wilson
(74) *Attorney, Agent, or Firm*—George Sai-Halasz; Robert M. Trepp

(57) ABSTRACT

MOSFET devices suitable for operation at gate lengths less than about 40 nm, and methods of their fabrication is being presented. The MOSFET devices include a ground plane formed of a monocrystalline Si based material. A Si based body layer is epitaxially disposed over the ground plane. The body layer is doped with impurities of opposite type than the ground plane. The gate has a metal with a mid-gap workfunction directly contacting a gate insulator layer. The gate is patterned to a length of less than about 40 nm, and possibly less than 20 nm. The source and the drain of the MOSFET are doped with the same type of dopant as the body layer. In CMOS embodiments of the invention the metal in the gate of the NMOS and the PMOS devices may be the same metal.

7 Claims, 6 Drawing Sheets

| Junction depth | Body Layer thickness | Ground Plane dopant concentration | Body Layer dopant concentration | Gate length 20nm | | Gate length 30nm | |
|---|---|---|---|---|---|---|---|
| | | | | $V_t$(sat) [V] | DIBL [mV/V] | $V_t$(sat) [V] | DIBL [mV/V] |
| 5nm | 5nm | 1E19 | 1.7E19 | 0.27 | 215 | 0.44 | 110 |
| 5nm | 5nm | 8E18 | 1.2E19 | 0.30 | 220 | 0.48 | 110 |
| 5nm | 7nm | 8E18 | 7.0E18 | 0.30 | 245 | 0.48 | 110 |

METAL GATED ULTRA SHORT MOSFET DEVICES

FIELD OF THE INVENTION

The present invention relates to electronic devices. In particular it relates to less than 40 nm gate length field effect devices and methods of producing such structures.

BACKGROUND OF THE INVENTION

Today's integrated circuits include a vast number of devices. Smaller devices and shrinking ground rules are the key to enhance performance and to improve reliability. As FET (Field Effect Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy.

There is great difficulty in maintaining performance improvements in devices of deeply submicron generations. Various detrimental device effects become more serious with successively decreasing device dimensions. For instance, with shortening gate lengths the so called short channel effects (SCEs), most notably drain-induced barrier lowering (DIBL) pose severe roadblocks to miniaturization. Also, parasitic capacitances, such as source and drain capacitance, stand in the way of device performance. At the same time, achieving ever higher gate capacitance runs into roadblocks, such as the depletion of the gate material, which traditionally has been poly-Si.

Traditionally, CMOS technologies advance from one generation to the next by scaling the gate length. This is accomplished by thinning the gate dielectric, increasing the channel doping and forming shallower source/drains. Thus far, gate dimensions have been scaled down to about 40 nm by using this approach for MOSFET (Metal Oxide Semiconductor Field-Effect-Transistor) devices with poly-Si gate electrodes. Many elements needed to support the gate length scaling scheme are approaching physical limitations. For instance, making junctions highly conductive, and simultaneously of shallow depth, with the use of ion implantation and annealing becomes very difficult, due to dopant activation and diffusion effects. For standard processes, higher dopant activation (at higher temperatures) is usually accompanied by additional diffusion issues and concerns. Furthermore, excessive junction leakage may prevent channel doping from being increased beyond the concentration needed to control short channel effects for less than 40 nm gate length devices. Thus, a new device design, architecture, and processing methodology is needed to overcome the drawbacks associated with the prior art.

SUMMARY OF THE INVENTION

In view of the problems discussed above this invention discloses a MOSFET suitable for operation at gate lengths less than 40 nm. Such a MOSFET device includes a ground plane formed of a monocrystalline Si based material. This ground plane has dopant impurities at a concentration of between about $1 \times 10^{18}/cm^3$ and $1 \times 10^{20}/cm^3$. A Si based body layer is epitaxially disposed over the ground plane with a thickness of between about 2 nm and 7 nm. The body layer is doped with impurities of opposite type than the ground plane at a concentration of between about $1 \times 10^{18}/cm^3$ and $5 \times 10^{19}/cm^3$. The transition region between the dopants of the ground plane and the dopants of the body layer has a width across their interface of between about 2.5 nm and 0.5 nm. A gate insulator layer is disposed over the body layer, and a gate is disposed over the gate insulator layer. The gate has a metal with a mid-gap workfunction directly contacting the gate insulator layer. The gate is patterned to a length of less than about 40 nm, and possibly less than 20 nm. The source and the drain of the MOSFET are doped with the same type of dopant as the body layer, with a concentration of between about $5 \times 10^{19}/cm^3$ and $2 \times 10^{20}/cm^3$. The junction depth of the source and the drain is less than about 7 nm.

In representative embodiments of the present invention the Si based material of the device is essentially pure Si.

In CMOS embodiments of the invention the metal in the gate of the NMOS and the PMOS devices may be the same metal.

A method for fabricating a MOSFET suitable for operation at gate lengths less than 40 nm is also disclosed. The method involves depositing by selective epitaxy a body layer of between about 2 nm and 7 nm thickness over a ground plane, and doping the ground plane and the body layer with opposite type of doping impurities. The method further includes disposing a mid-gap workfunction metal over the gate insulator. The metal may be selected to be the same metal for NMOS and PMOS devices in a CMOS configuration.

BRIEF DESCRIPTION OF THE DRAWINGS

These and other features of the present invention will become apparent from the accompanying detailed description and drawings, wherein:

FIG. 1C gives selected MOSFET device parameters as functions of structural parameters for selected preferred embodiments of the present invention;

DETAILED DESCRIPTION OF THE INVENTION

Figure 1A:
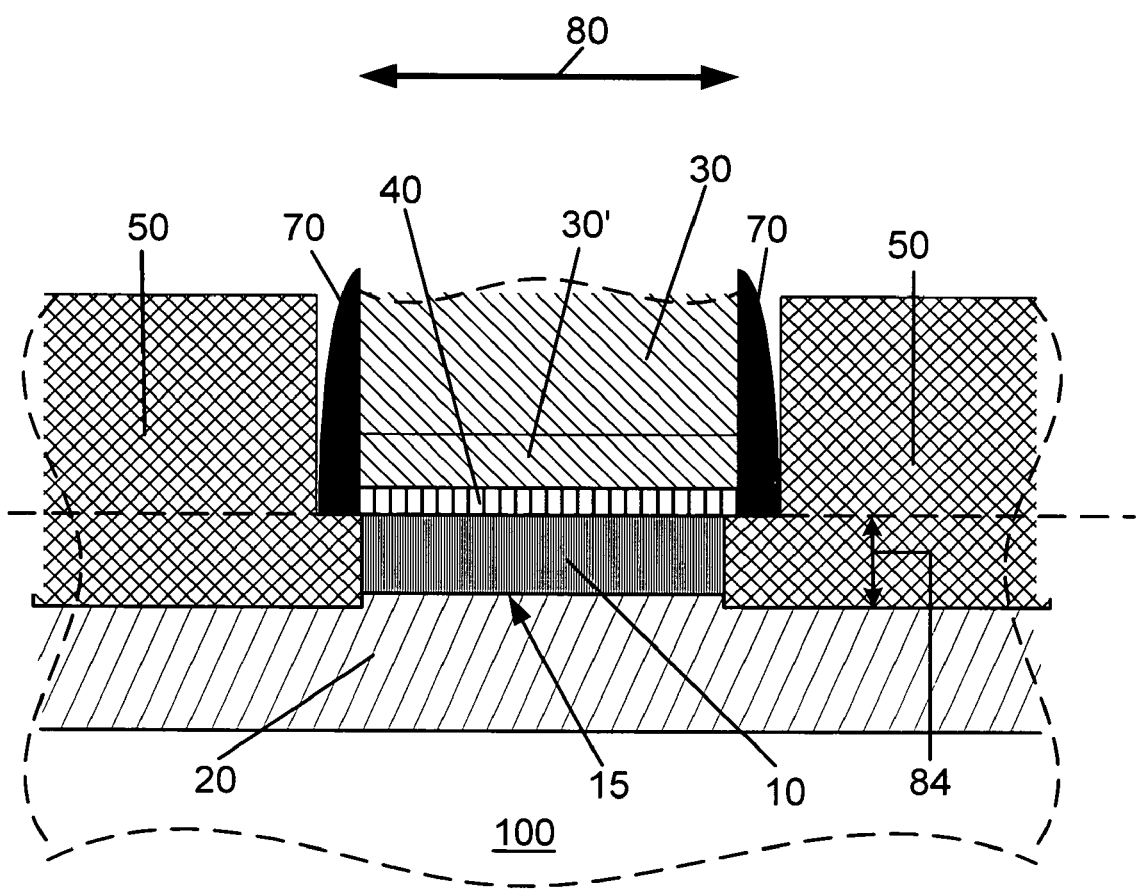
FIG. 1A shows, in a schematic cross sectional view, an embodiment, including raised source/drain, of a less than 40 nm gate length MOSFET.
Figure 1B:
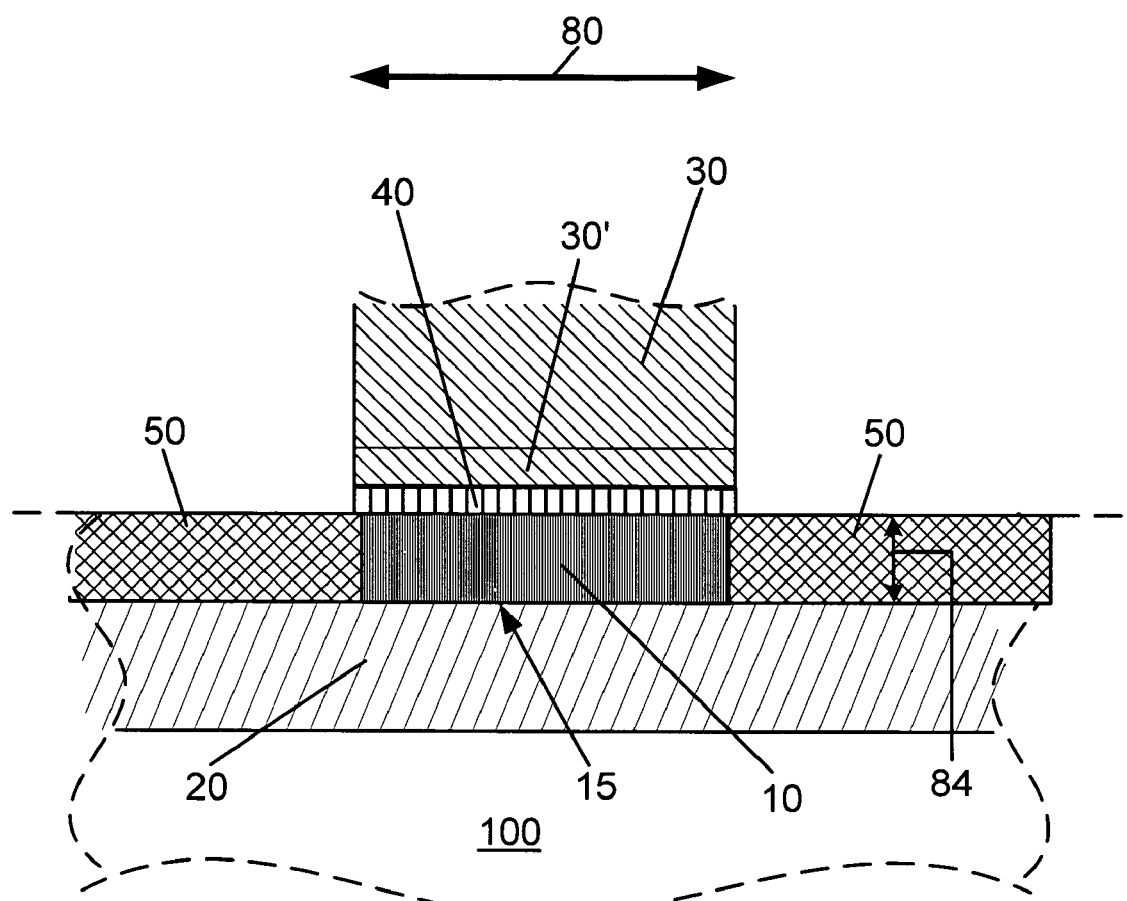
FIG. 1B shows, in a schematic cross sectional view, an alternate embodiment of a less than 40 nm gate length MOSFET.

FIG. 1A and FIG. 1B show, in a schematic cross sectional view, exemplary embodiments of ultra short, less than about 40 nm gate length MOSFET devices. The depicted embodiments incorporate elements that are instrumental in achieving useful characteristics for such ultra short gate length MOSFET devices. Embodiments of the present invention are aimed at gate lengths less than about 40 nm, with the 15 nm to 35 nm regime being preferred. It is also preferred that a mid-gap workfunction metal be the material which is in direct contact with the gate insulator. The metal gate electrode is preferred due to its high carrier concentration, which leads to low gate resistance and high gate capacitance. The term "mid-gap" means that the workfunction of the gate material, in the presented embodiments the metal, has a workfunction which is roughly halfway between the workfunctions of the p-type and n-type versions of the semiconductor material which forms the MOSFET. The workfunction of the gate material influences the device threshold ($V_t$). For ultra short MOSFET devices the desired threshold values are less than 0.5V, and possibly less than 0.2V. Satisfying such threshold requirements, coupled with fulfilling demands for high gate capacitance, and achieving acceptable short-channel effects (SCEs), such as drain-induced barrier lowering (DIBL), necessitates the inventive combinations of the present disclosure. These include high dopant concentration substrate, or ground plane, a device body hosting the channel which has the same doping type as the channel mobile carriers, and ultra shallow, sharp, junctions. The preferred doping ranges and physical dimensions of several device components are inventive, and contrary to the accepted teachings of the art. The sharp doping profiles needed to realize embodiments of the present invention are made possible by novel low temperature epitaxial techniques. In preferred embodiments of the invention the ultra short gate MOSFET devices are combined into CMOS configurations, in which the gates of the NMOS and PMOS devices may comprise the same mid-gap workfunction metal.

In the art of microelectronics the material that has progressed the farthest in miniaturization is silicon (Si). Si based materials are various alloys of Si in the same basic technological content as Si. One such Si based material of importance for microelectronics is the silicon-germanium (SiGe) alloy. The devices in the embodiments of the present invention are hosted in Si based materials, typically SiGe with an up to about 20% of Ge concentration. In exemplary embodiments of the invention the Si based material may be essentially pure Si.

Referring to FIG. 1A and FIG. 1B, the gate 30 of the MOSFET device is disposed over the gate insulator layer 40. The material which is in direct contact with the gate insulator layer 40 is a metal 30' with a mid-gap workfunction. Such metals are know in the art, they include W, Ta, TiN, and others. Through its workfunction value the gate metal 30' has influence over the device threshold. The indicating number 30' shows that the metal maybe part of a larger gate stack 30, which stack might include materials such as poly-Si and poly-SiGe. In representative embodiments the gate 30 might include only the mid-gap metal, containing no other materials. The wavy line terminating the top part of the gate 30 in the figures indicates the possibility that, as known in the art, several materials, or structures may be further involved in a completed gate stack, or electrode.

The length 80 of the gate 30 may be the most important device parameter determining device performance. The range of gate lengths 80 contemplated in representative embodiments of this invention are in the range of about 10 nm to about 40 nm, which is classified as an "ultra short" regime in the microelectronics art. In typical embodiments of the presented invention the gate length 80 is in the range of about 15 nm to about 35 nm.

Further referring to FIG. 1A and FIG. 1B, the device has a monocrystalline Si based body layer 10. The body of the device hosts the channel where the current conduction takes place along the interface with the gate insulator 40, on the side opposing the gate. The body layer 10 is epitaxially disposed over a ground plane 20. In representative embodiments the body layer 10 may be epitaxially grown on the ground plane 20. The terms "epitaxially", "epitaxy", "epi", etc. carry their customary usage: meaning the single crystal lattice structure carries across an interface. Typically in epitaxy a single crystal, or monocrystalline, material forms a platform onto which another single crystal material with matching crystalline characteristics is deposited by one of several techniques known in the art. Such techniques include, for instance, molecular beam epitaxy (MBE), and various types of chemical vapor depositions (CVD).

In exemplary embodiments of this invention the body layer 10 has a thickness in the range of about 2 nm to about 7 nm. In typical embodiments of the invention, the body layer 10 maybe about 5 nm thick. The body layer 10 is purposely doped with the same type of dopant as the carriers of the device current. Accordingly, for NMOS devices the body layer 10 is doped with n-type impurities, such as P, As, Sb, and others know in the art; and for PMOS devices the body layer 10 is doped with p-type impurities, such as B, Ga, I, and others know in the art. The concentration of the doping impurities in the body layer 10 is selected to be in the range of about $1 \times 10^{18}/cm^3$ to about $5 \times 10^{19}/cm^3$, with preferred embodiments having the range of about $5 \times 10^{18}/cm^3$ to about $5 \times 10^{19}/cm^3$. The selection of such dopant concentrations assures proper threshold value, good DIBL behavior, and high current carrying capability in the devices. In this disclosure, the dopant type found in the body layer 10, for referential purposes, is named "second type". Where the layer underneath the gate insulator is purposefully doped to be of the same type as the mobile channel charge, at times is referred to as "counter doped". The general concept of counter doping, typically used for so called depletion type devices, was known in the art, see for instance U.S. Pat. No. 5,780,899 to Hu. However, Hu does not teach the present invention.

The MOSFET device has a ground plane 20 formed of a monocrystalline Si based material. The dopant impurities in the ground plane are of a type opposite to the type of the mobile channel charge of the device. For NMOS devices the ground plane is p-type, doped with impurities such as B, Ga, I, and others know in the art; while for PMOS devices the ground plane is n-type, doped with impurities such as P, As, Sb, and others know in the art. In this disclosure the dopant type found in the ground plane 20, for referential purposes, is named "first type". The level of doping in the ground plane 20 influences important device behavioral parameters including the threshold value, and the size of DIBL. For the ultra short devices of the embodiments of the present invention, the acceptable doping for the ground plane 20 may be in the range of about $1 \times 10^{18}/cm^3$ to about $1 \times 10^{20}/cm^3$, with the preferred doping being in the range of about $8 \times 10^{18}/cm^3$ to about $1 \times 10^{19}/cm^3$.

For the voltages encountered in the operation of ultra short devices, which are typically less than about 2V, or even less than about 1.5V, the doping concentration in the ground plane limits the depletion regions to the range of less than about 20 nm. Consequently, beyond the thickness of about 20 nm the actual thickness of the ground plane is not a critical parameter in determining device behavior, and can comfortably be adjusted according to, for instance, ease of fabrication and design. The general concept of ground planes in MOSFET designs is known in the art, see for instance U.S. Pat. No. 6,391,752 to Colinge. However, Colinge does not teach the present invention.

Further referring to FIG. 1A and FIG. 1B, the body layer 10 and the ground plane 20 have a common interface 15. Across this interface an abrupt transition between the first and the second type of dopant impurities may be needed for the desirable operation of the MOSFET device. The selective epitaxial deposition of the body layer 10, and the in-situ doping of the body layer during the epitaxy may allow the desired abrupt transition between the dopant impurities of first type in ground plane 20 and the dopant impurities of the second type in body layer 10. In representative embodiments of the invention the region of transition between the first type and the second type of dopant impurities has a width across the ground plane/body layer interface 15 of between about 2.5 nm and 0.5 nm. The 0.5 nm width may represent a transition over about a single monolayer of the crystal structure.

The ground plane 20 is disposed over a substrate 100. If, as preferred in the embodiments of the present invention, the ground plane electrically isolates the device, then the nature of the substrate is of no major importance. Typically, the substrate 100 may be a Si wafer, Si-on-insulator (SOI) structure, SiGe-on-insulator (SGOI) structure, or an insulating layer, or another support structure known in the art.

FIG. 1A shows an exemplary embodiment where the source 50 and the drain 50 (both noted with the single reference numeral 50, since structurally they are interchangeable), are of a raised type. Creating shallow source/drain junctions by the technique of depositing material over the source and the drain is a technique known in the art. Such a fabrication may include a selective deposition process, an implantation, and a rapid thermal annealing, or a laser annealing. The height of the source/drain material protruding over the plane of the gate insulator/body layer interface, which interface is indicated by a dashed line in FIGS. 1A and 1B, may typically be about 25 nm. Implanting into a material of such thickness, coupled with rapid thermal annealing, or a laser annealing techniques as known in the art, can produce the desired junction properties for the MOSFET devices. In exemplary embodiments of the invention the dopant concentration in the source 50 and the drain 50 are in the range of about $5\times10^{19}/cm^3$ to about $2\times10^{20}/cm^3$, with the junction depths 84 not exceeding about 7 nm. Junction depths are given relative to the gate insulator/body layer interface, which interface is indicated with the dashed horizontal line in various figures.

In FIG. 1A the bottom of the source/drain junctions are drawn as being slightly deeper than the plane of the interface 15 between the ground plane 20 and the body layer 10. The relative position of the source/drain junction depth 84 compared to the body layer thickness should not be inferred, or limited, based on the depictions of the figures. The junction depth 84 and the body layer thickness are independently arrived at in various embodiments of the present invention, and while they both fall into roughly the same magnitude, each may be slightly larger then the other, depending on the details of a particular embodiment. The situation when the source/drain junction depth 84 and the body layer thickness approximately coincide is amongst the exemplary embodiments of the present invention.

FIG. 1B shows, in a schematic cross sectional view, an alternate embodiment where the source 50 and the drain 50 are not raised, but leveled as their top is approximately in the gate insulator/body layer interface plane. In embodiments of the present invention these leveled junctions have essentially the same dopant concentration and junction depth as junctions of the raised embodiments, namely a dopant concentration in the range of about $5\times10^{19}/cm^3$ to about $2\times10^{20}/cm^3$, and source/drain junction depths 84 of less than about 7 nm. These type of junctions in typical embodiments may be fabricated by selective deposition of the junction material and in-situ doping.

The gate insulator 40 of the device may be similar to ones know in the art. It may contain silicon dioxide, silicon oxynitride, as well as, so called high-k materials. The gate insulator may contain a crystalline portion, as well, as being epitaxially grown over the body layer 10. Although the gate insulator 40 may have many variation in its details, it is preferable for it to have an equivalent oxide thickness (EOT) of less than about 1 nm. The EOT, a concept known in the art, refers to the thickness of such an $SiO_2$ layer which has the same capacitance per unit area as the insulator layer in question.

FIG. 1A also depicts sidewall spacers 70 on the sides of the gate electrode. Such structures, and their fabrication, are know in the art, and they are depicted in some of the figures, as they may, or may not, be present in various embodiments of the invention.

Further referring to FIG. 1A and FIG. 1B, the lateral extension of the depicted MOSFET device is not shown, as indicated with the wavy lines. Any isolation technique used in the art in the fabrication of small devices, such as for instance, shallow trench isolation (STI), is suitable for the purposes of the embodiments of the present invention.

FIG. 1C gives selected MOSFET device parameters as the function of structural parameters for preferred embodiments of the present invention. The selected parameters of interest are the MOSFET device threshold at saturation $V_t(sat)$, (given in units of Volts), which is the threshold value when the drain is biased high; and the drain-induced barrier lowering, DIBL (given in units of milliVolts/Volts). The $V_t(sat)$ and DIBL values show that preferred embodiments of the present invention result in useful devices at such an ultra short gate length as 20 nm, or at even shorter gate lengths.

FIG. 2 through FIG. 6 schematically show the fabrication steps involved in the MOSFET devices and CMOS circuits of the embodiments of the present invention.

Figure 2:
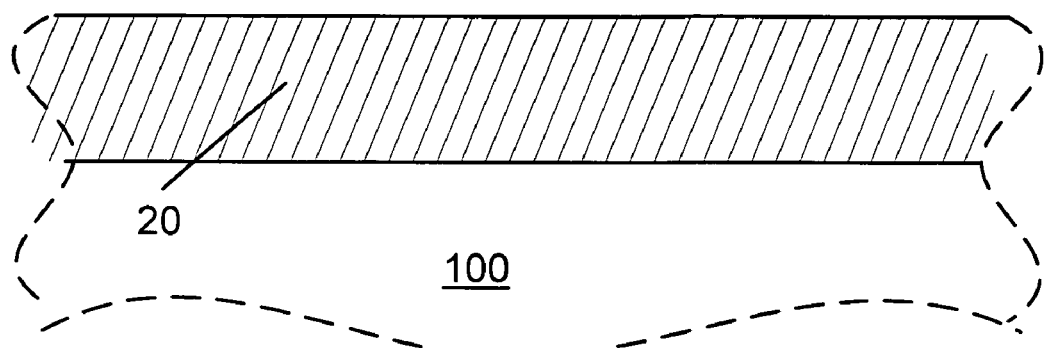
FIG. 2 shows, in a schematic cross sectional view, a stage in the processing of a less than 40 nm gate length MOSFET, where a ground plane has been fabricated.

FIG. 2 shows, in a schematic cross sectional view, a stage in the processing of a 40 nm gate length MOSFET where a ground plane 20 has been fabricated. The ground plane 20 is disposed over a substrate 100. Typically, the substrate 100 may be a Si wafer, SOI structure, SGOI structure, or an insulating layer, or an other support structure known in the art. Providing such a suitable substrate 100 may be the initial stage in the fabrication of the MOSFET device. The ground plane 20 may be created by implanting suitable dopant impurities into the substrate, followed by annealing, possibly by rapid thermal means, or by laser means.

In alternate embodiments the ground plane 20 may be epitaxially deposited over the monocrystalline substrate surface. During such deposition the ground plane may be in-situ doped. The meaning in the art of "in-situ doping" is that the doping impurities are introduced during the growth process. Other suitable means for creating the ground plane 20 are also known in the art, for instance layer transfer, and such means may be used in embodiments of the present invention. The ground plane 20 material is a Si based semiconductor, such as SiGe, possibly alloyed with further elements, such as C. In exemplary embodiments, the Si based semiconductor of the ground plane is essentially pure Si.

Figure 3:
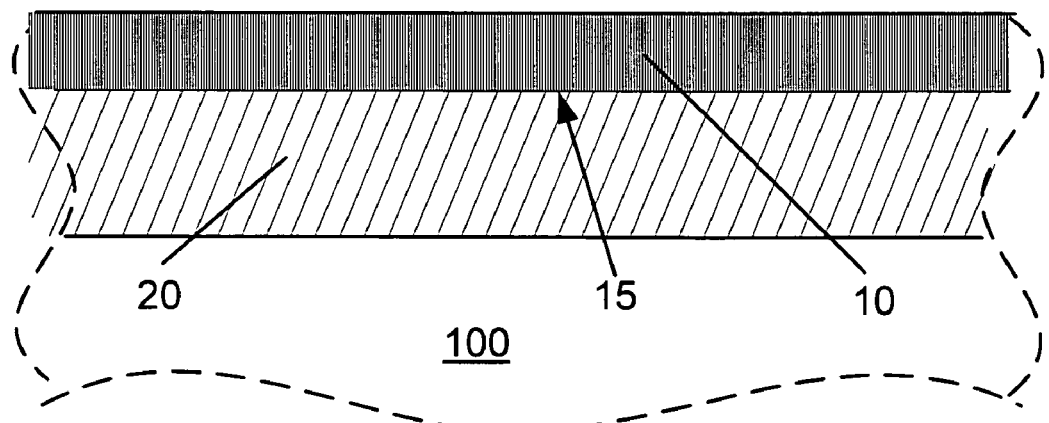
FIG. 3 shows, in a schematic cross sectional view, a stage in the processing of a less than 40 nm gate length MOSFET, where a counter doped body layer has been fabricated.

FIG. 3 shows, in a schematic cross sectional view, a stage in the processing of the MOSFET device where a counter doped body layer 10 has been fabricated. In representative embodiments of the invention a low temperature in-situ doped selective epitaxy process is used to form the body layer 10. The temperature range of the epitaxial process may be between about 500° C. and 650° C., and the doping range between about $1\times10^{18}/cm^3$ and $5\times10^{19}/cm^3$. A preferred process for the epitaxial deposition of the body layer 10 may be UHV-CVD (ultra-high-vacuum chemical-vapor-deposition). Such a deposition technique is described for instance in U.S. Pat. No. 5,906,680 to B. S. Meyerson, which is incorporated herein by reference. The low temperature of the epitaxial deposition may assure that the impurities in the ground plane 20 and those in the body layer 10 do not inter-diffuse. For this reason, the transition width across the ground plane/body layer interface 15 between the first type and the second type of dopant impurities can be kept in the range of about 2.5 nm to about 0.5 nm.

Figure 4:
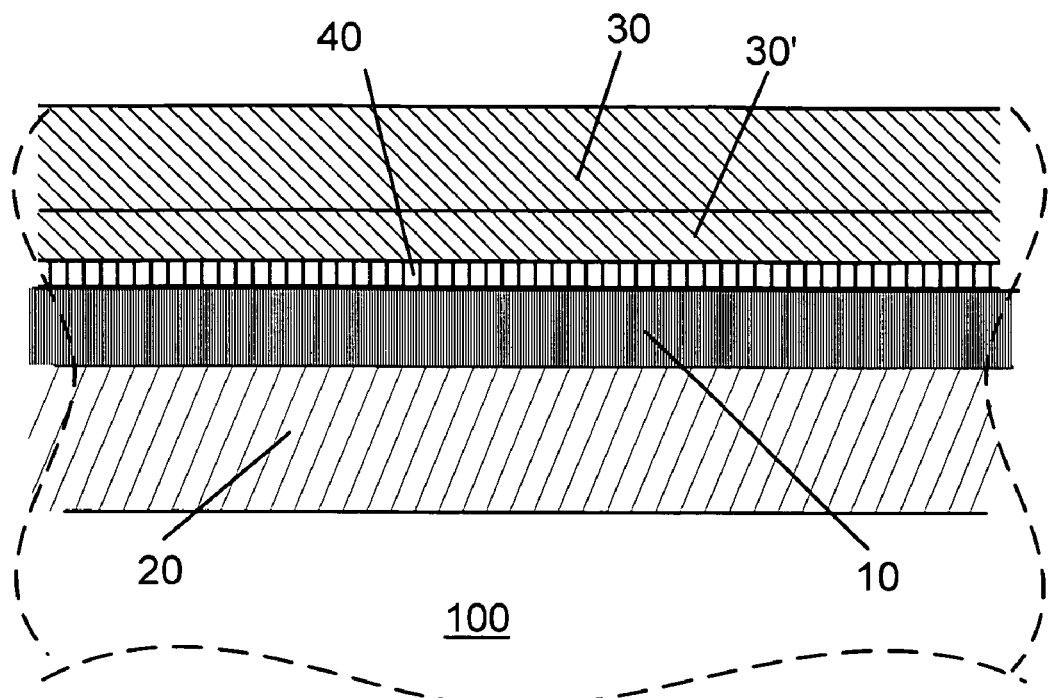
FIG. 4 shows, in a schematic cross sectional view, a stage in the processing of a less than 40 nm gate length MOSFET, where a gate insulator layer and a metal gate layer have been processed.

FIG. 4 shows, in a schematic cross sectional view, a stage in the processing of the MOSFET device when a gate insulator 40 has been disposed over the body layer 10, and the gate 30 has been disposed over the gate insulator 40. The gate insulator 40 in exemplary embodiments of the invention is fabricated by methods known in the art. The gate insulator 40 may be grown, or deposited. The gate insulator 40 may contain silicon dioxide, silicon oxynitride, as well as, so called high-k materials. The gate insulator 40 may also have a crystalline portion, as it may be epitaxially grown over the body layer 10.

The fabrication may continue with the disposing of a metal layer 30' with a mid-gap workfunction over the gate insulator 40. Such metals are know in the art, they include W, Ta, TiN, and others. Disposed over the metal layer 30' may be other material layers that in combination with the metal layer 30' together form the gate stack, or gate electrode 30.

It is understood that apart from the discussed fabrication processes, a large number of additional steps may have to be performed during the fabrication of the MOSFET devices. Such may include, for instance, cleaning, etching, patterning, and other steps, as it is known in the art. It is also understood that in the case of fabricating CMOS circuits most of the processes outlined here have to be done separately for both the NMOS and PMOS devices. When one of the device types is being acted upon, the other type is usually being covered by masking. However, this may not be the case for disposing the mid-gap workfunction metal layer 30'. In preferred CMOS circuit embodiments of the invention the NMOS and PMOS devices may have an identical metal of mid-gap workfunction disposed over their respective gate dielectrics, and possibly, but not necessarily, during the same processing step.

Figure 5:
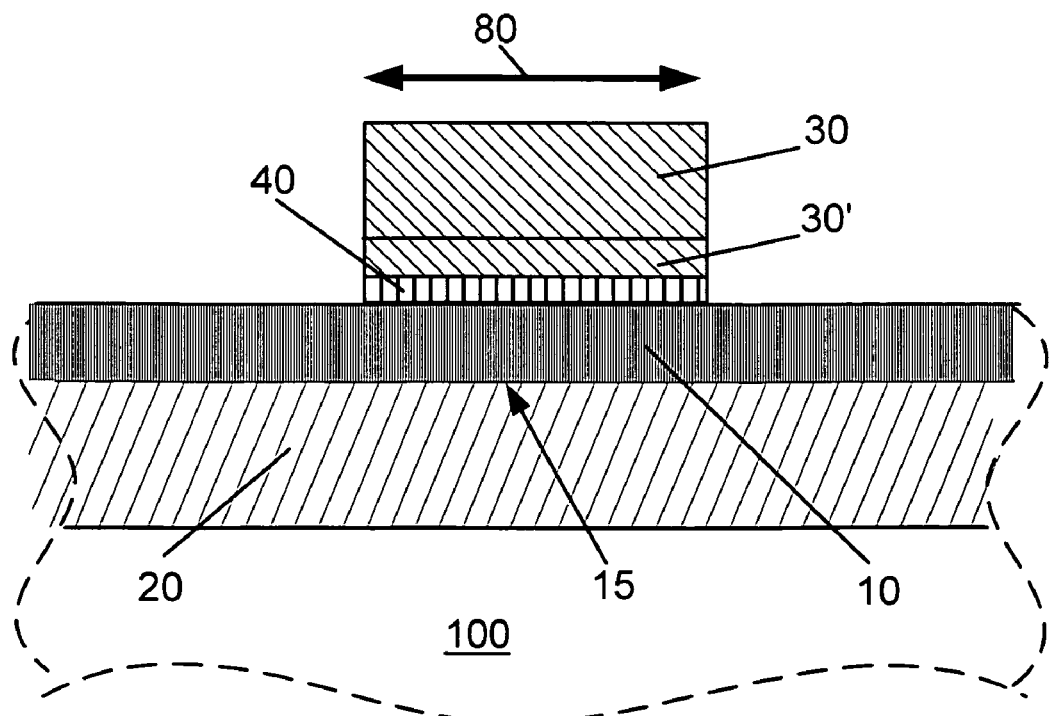
FIG. 5 shows, in a schematic cross sectional view, a stage in the processing of a less than 40 nm gate length MOSFET, where the gate has been patterned.

FIG. 5 shows, in a schematic cross sectional view, a stage in the processing of the MOSFET device where the gate has been patterned. Such patterning may follow lithography techniques know in the art. Typically, such a lithographic process defines the final, less than 40 nm, gate length 80.

Figure 6A:
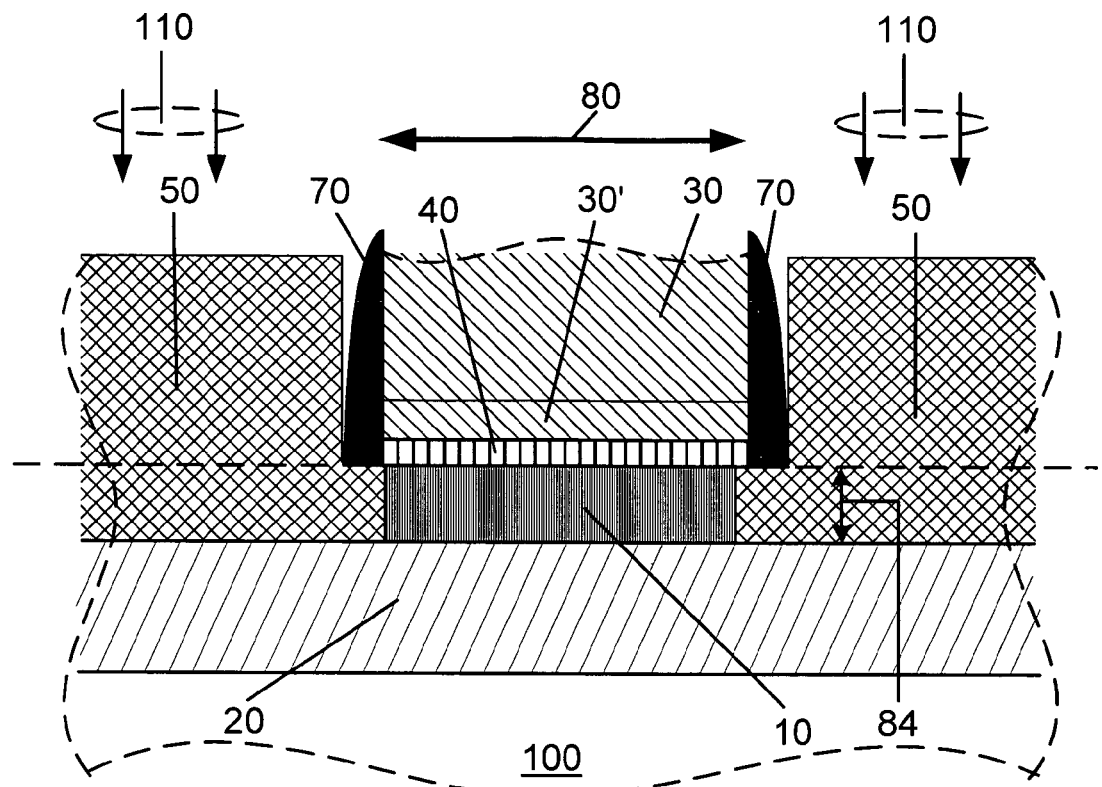
FIG. 6A shows, in a schematic cross sectional view, a stage in the processing of a less than 40 nm gate length MOSFET, where the raised source/drain junctions are being formed.
Figure 6B:
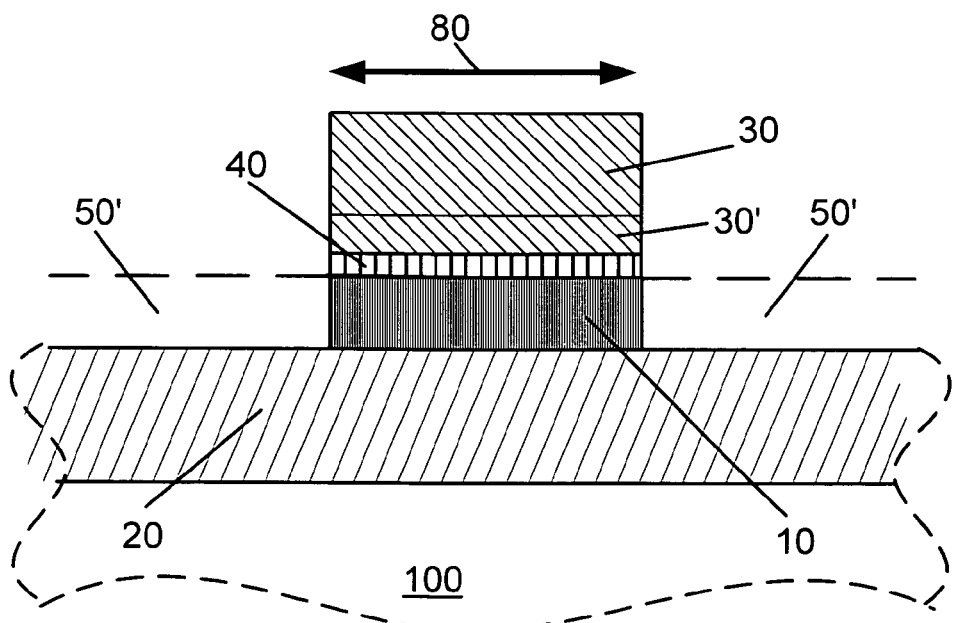
FIG. 6B shows, in a schematic cross sectional view, a stage in the processing of a less than 40 nm gate length MOSFET, where the source/drain regions are hollowed for selective deposition the of source/drain junctions.

FIG. 6A and FIG. 6B show in a schematic cross sectional view, stages of differing embodiments of the source/drain 50 processing.

Referring to FIG. 6A, the device after the gate patterning may undergo steps known in the art, such as the sidewall spacer 70 formation on the sides of the gate electrode. In representative embodiments of the present invention the source/drain formation involves selective material deposition, thereby raising the source/drain 50. The height of the source/drain protrusion may be of about 25 nm. The raised source/drain then will be implanted 110 with the proper dopant impurity type, using an implant energy and dose in such a manner that after an annealing procedure, which may be a rapid thermal annealing, or a laser annealing process, the source and drain junctions end up with a depth 84 which is less than about 7 nm.

Referring to FIG. 6B, in alternate embodiments of the invention a different approach may be employed to achieve shallow, highly doped junctions. In this case, material is hollowed out in the locations of the source/drain 50', and a selective deposition is used to grow back the source/drain, resulting in the completion of the embodiment as it is shown in FIG. 1B. During the growth process the desired doping level is in-situ provided. The final shallow, less than about 7 nm, junction depth may be reached by the proper combination of the depth of the hollowing of the source/drain regions 50', and the deposition process parameters.

In preferred embodiments of the present invention the processes of forming of the ground plane, depositing of the body layer, forming of the gate insulator layer, forming of the gate, may all be carried out in a UHV-CVD system, without the breaking of the vacuum. A system capable for such a degree of integration has been disclosed in U.S. Pat. No. 6,013,134 to J. Chu et al, which is incorporated herein by reference. The integration of the fabrication process, including maintaining vacuum in the deposition system even between successive steps, may allow for the abrupt interfaces and transitions practiced in embodiments of the present invention. Such an abrupt transition is, for instance, the dopant impurity type change across the ground plane/body layer interface 15, which transition is of between about 2.5 nm and 0.5 nm. The 0.5 nm width may represent a transition over about a single monolayer of the crystal structure.

Many modifications and variations of the present invention are possible in light of the above teachings, and could be apparent for those skilled in the art. The scope of the invention is defined by the appended claims.

We claim:

1. A MOSFET device, comprising:
    a ground plane formed of a monocrystalline Si based material, wherein said ground plane has dopant impurities of a first type with a concentration of between about $1\times10^{18}/cm^3$ and $1\times10^{20}/cm^3$;
    a Si based body layer epitaxially disposed on said ground plane and having an interface with said ground plane, wherein said body layer has a thickness of between about 2 nm and 7 nm, wherein said body layer has dopant impurities of a second type with a concentration of between about $5\times10^{18}/cm^3$ and $5\times10^{19}/cm^3$, wherein a region of transition between said first type and said second type of dopant impurities has a width across said interface of between about 2.5 nm and 0.5 nm;
    a gate insulator layer disposed over said body layer;
    a gate disposed over said gate insulator layer, wherein said gate comprises a metal with a mid-gap workfunction, wherein said metal is in direct contact with said gate insulator layer, wherein said gate has a length of less than about 40 nm; and a source and a drain, wherein said source and said drain have dopant impurities of said second type with a concentration of between about $5\times10^{19}/cm^3$ and $2\times10^{20}/cm^3$, and wherein said source and said drain have junction depths of less than about 7 nm.

2. The MOSFET device of claim 1, wherein said length of said gate is between about 15 nm and 35 nm.

3. The MOSFET device of claim 1, wherein said dopant impurities of said first type are n-type, and said dopant impurities of said second type are p-type.

4. The MOSFET device of claim 1, wherein said dopant impurities of said first type are p-type, and said dopant impurities of said second type are n-type.

5. The MOSFET device of claim 1, wherein said source and said drain are of a raised type source/drain.

6. The MOSFET device of claim 1, wherein said monocrystalline Si based material and said Si based body layer are essentially pure Si.

7. A CMOS circuit, comprising:

at least one NMOS device, wherein said NMOS device further comprises:

a ground plane formed of a monocrystalline Si based material, wherein said ground plane has p-type impurities with a concentration of between about $1\times10^{18}/cm^3$ and $1\times10^{20}/cm^3$;

a Si based body layer epitaxially disposed on said ground plane and having an interface with said ground plane, wherein said body layer has a thickness of between about 2 nm and 7 nm, wherein said body layer has n-type impurities with a concentration of between about $5\times10^{18}/cm^3$ and $5\times10^{19}/cm^3$, wherein a region of transition between said p-type and said n-type impurities has width across said interface of between about 2.5 nm and 0.5 nm;

a source and a drain, wherein said source and said drain have n-type impurities with a concentration of between about $5\times10^{19}/cm^3$ and $2\times10^{20}/cm^3$, and wherein said source and said drain have junction depths of less than about 7 nm;

and, at least one PMOS device, wherein said PMOS device further comprises:

a ground plane formed of a monocrystalline Si based material, wherein said ground plane has n-type impurities with a concentration of between about $1\times10^{18}/cm^3$ and $1\times10^{19}/cm^3$;

a Si based body layer epitaxially disposed on said ground plane and having an interface with said ground plane, wherein said body layer has a thickness of between about 2 nm and 7 nm, wherein said body layer has p-type impurities with a concentration of between about $5\times10^{18}/cm^3$ and $5\times10^{19}/cm^3$, wherein a region of transition between said n-type and said p-type impurities has width across said interface of between about 2.5 nm and 0.5 nm;

a source and a drain, wherein said source and said drain have p-type impurities with a concentration of between about $5\times10^{19}/cm^3$ and $2\times10^{20}/cm^3$, and wherein said source and said drain have junction depths of less than about 7 nm;

and, wherein each of said at least one NMOS device and said at least one PMOS device further comprise:

a gate insulator layer disposed over said body layer;

a gate disposed over said gate insulator layer, wherein said gate comprises a metal with a mid-gap workfunction, wherein said metal is in direct contact with said gate insulator layer, and wherein said metal of said NMOS gate and said metal of said PMOS gate are identical metals.

* * * * *